(12) United States Patent
Miao et al.

(10) Patent No.: US 9,564,218 B2
(45) Date of Patent: Feb. 7, 2017

(54) ASSOCIATIVE MEMORY CIRCUIT

(71) Applicant: Huazhong University of Science and Technology, Wuhan (CN)

(72) Inventors: Xiangshui Miao, Wuhan (CN); Yi Li, Wuhan (CN); Lei Xu, Wuhan (CN); Yingpeng Zhong, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 110 days.

(21) Appl. No.: 14/601,216

(22) Filed: Jan. 20, 2015

(65) Prior Publication Data

US 2015/0131355 A1    May 14, 2015

Related U.S. Application Data

(63) Continuation-in-part of application No. PCT/CN2013/086555, filed on Nov. 5, 2013.

(30) Foreign Application Priority Data

Oct. 28, 2013  (CN) .......................... 2013 1 0516829

(51) Int. Cl.
*G11C 15/04* (2006.01)
*G11C 11/54* (2006.01)
*G11C 13/00* (2006.01)

(52) U.S. Cl.
CPC ............. *G11C 15/046* (2013.01); *G11C 11/54* (2013.01); *G11C 13/0007* (2013.01)

(58) Field of Classification Search
CPC .... G11C 15/46; G11C 15/046; G11C 13/0007
USPC ........................................................ 365/49.17
See application file for complete search history.

(56) References Cited

U.S. PATENT DOCUMENTS

| | | | |
|---|---|---|---|
| 2012/0127780 A1* | 5/2012 | Strachan ............ | G11C 13/0007 365/148 |
| 2012/0194967 A1* | 8/2012 | Keane .................... | H01C 13/00 361/437 |
| 2012/0330873 A1* | 12/2012 | Suri ........................ | H01L 45/04 706/26 |
| 2013/0010521 A1* | 1/2013 | Carter ................ | G11C 13/0002 365/148 |

(Continued)

*Primary Examiner* — Hoai V Ho
*Assistant Examiner* — Muna A Techane
(74) *Attorney, Agent, or Firm* — Matthias Scholl, PC; Matthias Scholl

(57) ABSTRACT

An associative memory circuit including a first memristor, a second memristor, a fixed value resistor R, and an operational comparator. One terminal of the first memristor is a first input terminal of the associative memory circuit, and the other terminal of the first memristor is connected to a first input terminal of the operational comparator. One terminal of the second memristor is a second input terminal of the associative memory circuit, and the other terminal of the second memristor is connected to the first input terminal of the operational comparator. One terminal of the fixed value resistor is connected to the first input terminal of the operational comparator, and the other terminal of the fixed value resistor is connected to the ground. A second input terminal of the operational comparator is connected to a reference voltage.

10 Claims, 6 Drawing Sheets

(56) References Cited

U.S. PATENT DOCUMENTS

2013/0128652 A1\* 5/2013 Krueger .................. G11C 11/21
365/148

\* cited by examiner

ASSOCIATIVE MEMORY CIRCUIT

CROSS-REFERENCE TO RELATED APPLICATIONS

This application is a continuation-in-part of International Patent Application No. PCT/CN2013/086555 with an international filing date of Nov. 5, 2013, designating the United States, now pending, and further claims priority benefits to Chinese Patent Application No. 201310516829.2 filed Oct. 28, 2013. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND OF THE INVENTION

Field of the Invention

The invention relates to a memristor-based associative memory circuit.

Description of the Related Art

Conventionally, associative memory function is achieved by CMOS circuits. However, the associative memory function requires a large amount of electronic components, a large-scale circuit, and high power consumption. Meanwhile, this method does not provide a basic biological model of the associative memory based on a time relationship of a stimulation signal.

SUMMARY OF THE INVENTION

In view of the above-described problems, it is one objective of the invention to provide a memristor-based associative memory circuit capable of simulating a generation process and a forgetting process of biological associative memory.

To achieve the above objective, in accordance with one embodiment of the invention, there is provided a memristor-based associative memory circuit for simulating associative memory behavior of living beings, the associative memory circuit comprises a first memristor, a second memristor, a fixed value resistor, and an operational comparator. One terminal of the first memristor operates as a first input terminal of the associative memory circuit, and the other terminal of the first memristor is connected to a first input terminal of the operational comparator; one terminal of the second memristor operates as a second input terminal of the associative memory circuit, and the other terminal of the second memristor is connected to the first input terminal of the operational comparator; one terminal of the fixed value resistor is connected to the first input terminal of the operational comparator, and the other terminal of the fixed value resistor is connected to the ground; a second input terminal of the operational comparator is connected to a reference voltage, and an output terminal of the operational comparator operates as an output terminal of the associative memory circuit, and the first input terminal and the second input terminal of the associative memory circuit operate to receive a conditional stimulation signal and an unconditional stimulation signal, respectively, and the output terminal of the associative memory circuit operates to output a response signal.

In accordance with another aspect of the invention, there is provided a memristor-based associative memory circuit for simulating associative memory behavior of living beings, the associative memory circuit comprises a memristor, a first resistor, a second resistor, and an operational comparator. One terminal of the memristor operates as a first input terminal of the associative memory circuit, and the other terminal of the memristor is connected to a first input terminal of the operational comparator; one terminal of the first resistor operates as a second input terminal of the associative memory circuit, and the other terminal of the first resistor is connected to the first input terminal of the operational comparator; one terminal of the second resistor is connected to the first input terminal of the operational comparator, and the other terminal of the second resistor is connected to the ground, a second input terminal of the operational comparator is connected to a reference voltage, and an output terminal of the operational comparator operates as an output terminal of the associative memory circuit, and the first input terminal and the second input terminal of the associative memory circuit operate to receive a conditional stimulation signal and an unconditional stimulation signal, respectively, and the output terminal of the associative memory circuit operates to output a response signal.

In accordance with a further aspect of the invention, there is provided a memristor-based associative memory circuit for simulating associative memory behavior of living beings, the associative memory circuit comprises a memristor, a first resistor, a second resistor, and an operational comparator. The first resistor and the memristor are sequentially connected to a first input terminal of the operational comparator in series, and a non-series connected terminal of the memristor operates as a first input terminal of the associative memory circuit, a serially connected terminal of the first resistor and the memristor operates as a second input terminal of the associative memory circuit, one terminal of the second resistor is connected to the first input terminal of the operational comparator, and the other terminal of the second resistor is connected to the ground, a second input terminal of the operational comparator is connected to a reference voltage, and an output terminal of the operational comparator operates as an output terminal of the associative memory circuit, and the first input terminal and the second input terminal of the associative memory circuit operate to receive a conditional stimulation signal and an unconditional stimulation signal, respectively, and the output terminal of the associative memory circuit operates to output a response signal.

In a class of this embodiment, as the conditional stimulation signal is input immediately prior to the unconditional stimulation signal, or both the conditional stimulation signal and the unconditional stimulation signal are input simultaneously, the associative memory circuit realizes associative memory, as the conditional stimulation signal is input after the unconditional stimulation signal, the associative memory circuit cannot realize the associative memory, and after the associative memory is realized, when the conditional stimulation signal and the unconditional stimulation signal are input simultaneously, as the conditional stimulation signal leads the unconditional stimulation signal for a very long time, the associative memory is to be forgotten, when only the conditional stimulation signal is continuously input, the associative memory is to be forgotten.

In a class of this embodiment, a resistance value of the fixed value resistor is approximately equal to a low resistance value of the memristor.

In a class of this embodiment, a value of the reference voltage is determined by a voltage value of a signal applied to the first input terminal of the operational comparator.

In a class of this embodiment, the memristor comprises a first electrode layer, a functional material layer, and a second electrode layer that are sequentially and electrically connected.

In a class of this embodiment, the functional material layer is a functional material layer made of oxide comprising $TiO_x$, $TaO_x$, $WO_x$, $CuO_x$, $AlO_x$, $NiO_x$, $HfO_x$, $ZrO_x$, $SiO_x$, $NbO_x$, $VO_x$, or $GeO_x$.

In a class of this embodiment, the functional material layer is a functional material layer made of chalcogenide comprising GeSe, $Ag_2Se$, $Ag_2S$, $Cu_2S$, $GeS_x$, $Ge_2Sb_2Te_5$, GeTe, or AgInSbTe.

In a class of this embodiment, the functional material layer is a functional material layer made of materials of perovskite structure comprising $SrTiO_3$, $BaTiO_3$, $BiFeO_3$, $CaMnO_3$, $PrMnO_3$, or $La_{0.7}Sr_{0.3}MnO_3$.

The memristor of the invention is adapted to vary a weight thereof via input signals applied on a single input terminal or two input terminals, and thus realizing synaptic plasticity of a biological neutron. The associative memory circuit of the invention can simulate a generation process and a forgetting process of biological associative memory according to a time relationship between the conditional stimulation signal and the unconditional stimulation signal.

BRIEF DESCRIPTION OF THE DRAWINGS

FIG. 5 is a curve illustrating a relationship between an input signal and a memristor of a first embodiment of the invention.

FIG. 6 is a curve illustrating a relationship between an input signal and a memristor of a second embodiment of the invention.

FIG. 10 is a curve illustrating a relationship between an input signal and a memristor of a sixth embodiment of the invention.

DETAILED DESCRIPTION OF THE EMBODIMENTS

Figure 1:
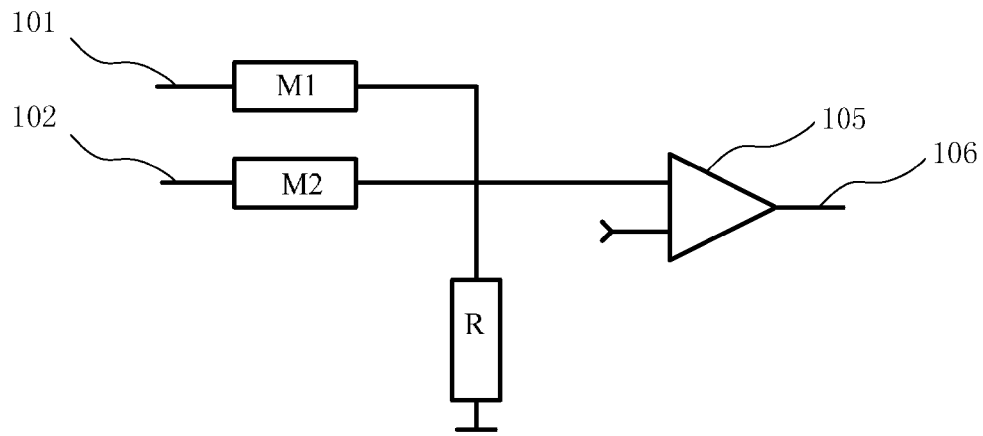
FIG. 1 is a schematic diagram of a memristor-based associative memory circuit of a first embodiment of the invention.

For clear understanding of the objectives, features and advantages of the invention, detailed description of the invention will be given below in conjunction with accompanying drawings and specific embodiments. It should be noted that the embodiments are only meant to explain the invention, and not to limit the scope of the invention.

It is an objective of the invention to provide a memristor-based associative memory circuit capable of enabling an associative memory function like human brains. The circuit is formed by a memristor-based artificial synapse component and conventional electronic components (resistors and operational amplifiers). As a novel electronic component with a special non-linear resistance switching characteristic, a memristor can be used for a neural network. Since a resistance of the memristor may change with electric charge passing therethrough, and it is possible to adjust a resistance value of the memristor by applying electric pulses thereto, which is similar to changing a weight of a biological neural synapse via a bioelectric signal. Therefore, the memristor can be used as an artificial synapse component, and is superior to a conventional neural network circuit in terms of speed, power consumption, and integration.

The artificial synapse component of the memristor of the invention is capable of simulating a function of a biological neural synapse, comprising adjusting a weight of the synapse and enabling the weight to vary according to time difference between pulses prior to and following the synapse, and realizing a spike timing dependent plasticity (STDP) function. The neural synapse is a two-terminal resistor with one terminal being a presynaptic terminal, and the other being a postsynaptic terminal. A resistance value thereof varies based on a direction of current flowing therethrough, namely, forward current causes the resistance value to increase, and reverse current causes the value to decrease. However, as the current is less than a threshold, the resistance value is not to vary. It is possible to realize the STDP function by designing a presynaptic or postsynaptic signal, and details of realization will be described hereinafter in conjunction with specific embodiments.

The associative memory circuit of the invention can simulate associative memory behavior of living beings, and comprises two signal input terminals and a signal output terminal. The signal input terminals are formed by artificial neural components or resistors, and simulate two sensory neutrons of the living beings for receiving a conditional stimulation signal (CS) and an unconditional stimulation signal (US), respectively. The signal output terminal is formed by a comparator, and simulates motor neutrons of the living beings for outputting a response signal.

Like a human brain, the memristor-based artificial neural network circuit of the invention is capable of enabling an associative memory function based on a time relationship between stimulation signals.

FIG. 1 illustrates an associative memory circuit 1 of the invention, comprising a first signal input terminal 101, a second signal input terminal 102, and a signal output terminal 106. The circuit is formed by two artificial synapse components M1 and M2, a fixed value resistor R, and an operational comparator 105, and the operational comparator 105 may employ a LM339-type comparator.

In this example, a resistance value of the fixed value resistor R is selected based on a high-resistance value and a low-resistance value of the memristor. Normally, the resistance value of the fixed value resistor is approximately equal to the low-resistance value of the memristor. Selection of a reference voltage of the operational comparator 105 is determined by a voltage value after voltage-division of a signal applied to the comparator at an input terminal thereof, which enables a signal incapable of generating an output to be less than the voltage value, and a signal capable of generating an output to be greater than the voltage value.

Figure 2:
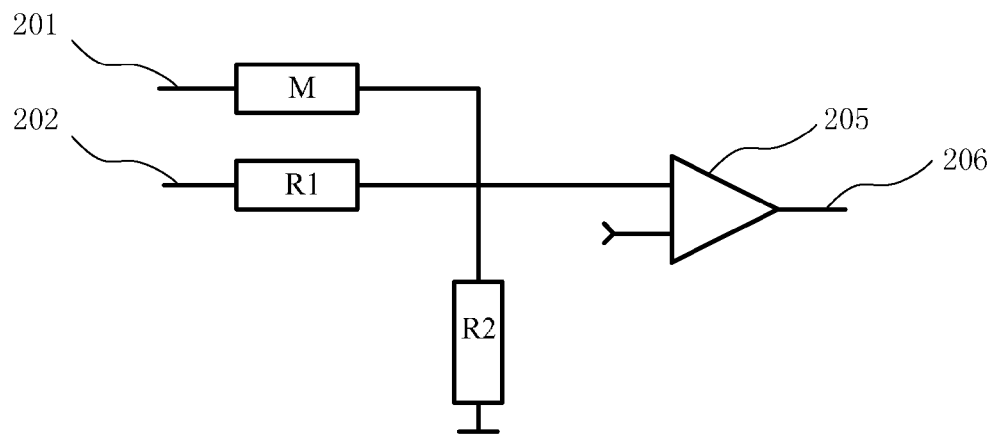
FIG. 2 is a schematic diagram of a memristor-based associative memory circuit of a second embodiment of the invention.

FIG. 2 illustrates another associative memory circuit 2 of the invention, comprising a first signal input terminal 201, a second signal input terminal 202, and a signal output terminal 206. The circuit is formed by an artificial synapse component M, two fixed value resistors R1 and R2, and an operational comparator 205, and the operational comparator 205 may employ a LM339-type comparator.

In this example, a resistance value of each of the fixed value resistors R1 and R2 is selected based on a high-resistance value and a low-resistance value of the memristor. Normally, the resistance value of the fixed value resistor is approximately equal to the low-resistance value of the memristor (in principle, the resistance value of R1 and R2 may both be equal to the low-resistance value of the memristor, but since a range of the resistance value of R1 is much wider than that of R2, and may cause an unconditional stimulation signal after voltage division to affect functions of the whole circuit, so here the value is equal to the low-resistance value, and other modification can be made if claimed scope is taken into consideration). Selection of a reference voltage of the operational comparator is determined by a voltage value after voltage-division of a signal applied to the comparator at an input terminal thereof, which enables a signal incapable of generating an output to be less than the voltage value, and a signal capable of generating an output to be greater than the voltage value.

Figure 3:
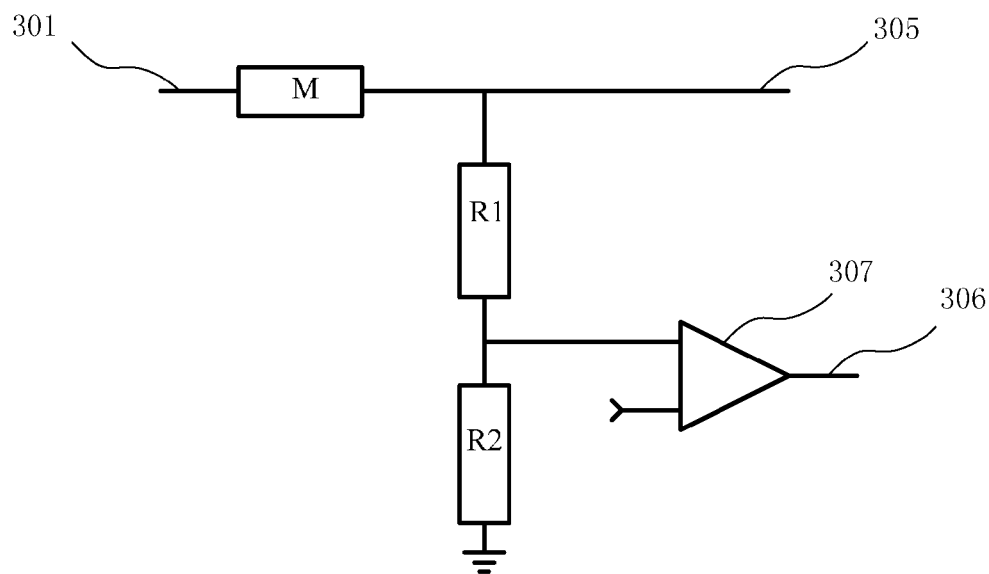
FIG. 3 is a schematic diagram of a memristor-based associative memory circuit of a third embodiment of the invention.

FIG. 3 illustrates a further associative memory circuit 3 of the invention, comprising a first signal input terminal 301, a second signal input terminal 305, and a signal output terminal 306. The circuit is formed by an artificial synapse component M, two fixed value resistors R1 and R2, and an operational comparator (LM339-type) 307. A resistance value of the fixed value resistor is selected based on a high-resistance value and a low-resistance value of the memristor. Normally, the resistance value of the fixed value resistor is approximately equal to a low-resistance value of the memristor. Selection of a reference voltage of the operational comparator is determined by a voltage value after voltage-division of a signal applied to the comparator at an input terminal thereof, which enables a signal incapable of generating an output to be less than the voltage value, and a signal capable of generating an output to be greater than the voltage value.

In this example, the memristor-based associative memory circuit can simulate associative memory behavior of living beings' brains, comprising a generation process and a forgetting process of associative memory based on conditional stimulation and unconditional stimulation. The circuit is formed by two signal input terminals and a signal output terminal operating to simulate two sensory neutrons and a motor neutron in a biological associative memory model, respectively. The signal input terminal is formed by a memristor or directly connected thereto, the signal output terminal is formed by a resistor and an operational comparator, and the memristor operates as an artificial synapse component. As electric input signals with different polarity (positive or negative) are input, resistance of an artificial synapse operating as an input terminal of the circuit may vary in different directions (namely increasing or decreasing). A spike timing dependent plasticity (STDP) function of the circuit is: as $\Delta t>0$, $\Delta W>0$ and exponentially attenuates with $\Delta t$, and as $\Delta t<0$, $\Delta W<0$ and exponentially attenuates with $\Delta t$, which enable the associative memory behavior to biologically satisfy a time relationship between the conditional stimulation signal and the unconditional stimulation signal. To summarize, a basis for realizing the associative memory function is that pulse time of the artificial synapse component is dependent on the STDP.

As the conditional stimulation signal is input immediately prior to the unconditional stimulation signal, or both the conditional stimulation signal and the unconditional stimulation signal are input simultaneously, the associative memory circuit realizes associative memory, as the conditional stimulation signal is input after the unconditional stimulation signal, the associative memory circuit cannot realize the associative memory, and after the associative memory is realized, when the conditional stimulation signal and the unconditional stimulation signal are input simultaneously, as the conditional stimulation signal leads the unconditional stimulation signal for a very long time, the associative memory is to be forgotten, when only the conditional stimulation signal is continuously input, the associative memory is to be forgotten.

Figure 4:
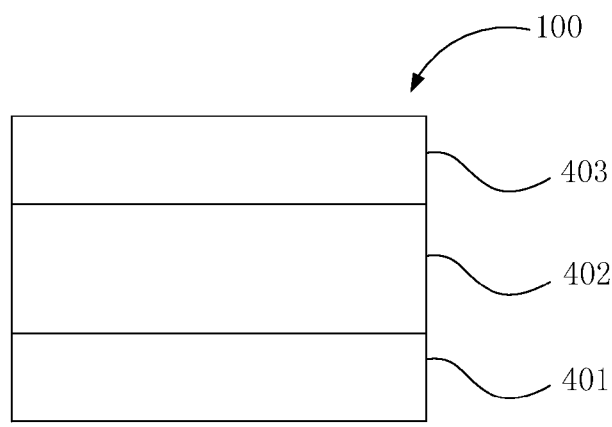
FIG. 4 is a schematic diagram of a memristor in an associative memory circuit of the invention.

As shown in FIG. 4, the memristor-based artificial synapse component of the invention comprises a first electrode layer 401, a second electrode layer 403, and a functional material layer 402 disposed between the first electrode layer 401 and the second electrode layer 403. The first electrode layer 401 is electrically contacted with the functional material layer 402, and the functional material layer 402 is electrically contacted with the second electrode layer 403. The functional material layer 402 may be a functional material layer made of oxide comprising $TiO_x$, $TaO_x$, $WO_x$, $CuO_x$, $AlO_x$, $NiO_x$, $HfO_x$, $ZrO_x$, $SiO_x$, $NbO_x$, $VO_x$, $GeO_x$ and so on, the functional material layer 402 may also be a functional material layer made of chalcogenide comprising GeSe, $Ag_2Se$, $Ag_2S$, $Cu_2S$, $GeS_x$, $Ge_2Sb_2Te_5$, GeTe, AgInSbTe and so on, and the functional material layer 402 may also be a functional material layer made of materials of perovskite structure comprising $SrTiO_3$, $BaTiO_3$, $BiFeO_3$, (Pr, Ca)$MnO_3$, $La_{0.7}Sr_{0.3}MnO_3$ and so on.

FIG. 5 illustrates a function of adjusting a weight of a neural synapse according to an embodiment of the invention, in which a pulse signal is applied to the second electrode layer 403, the first electrode layer 401 is connected to the ground, and the functional material layer 402 is a resistor of an artificial synapse 100 between the first electrode layer 401 and the second electrode layer 403.

Figure 5A:
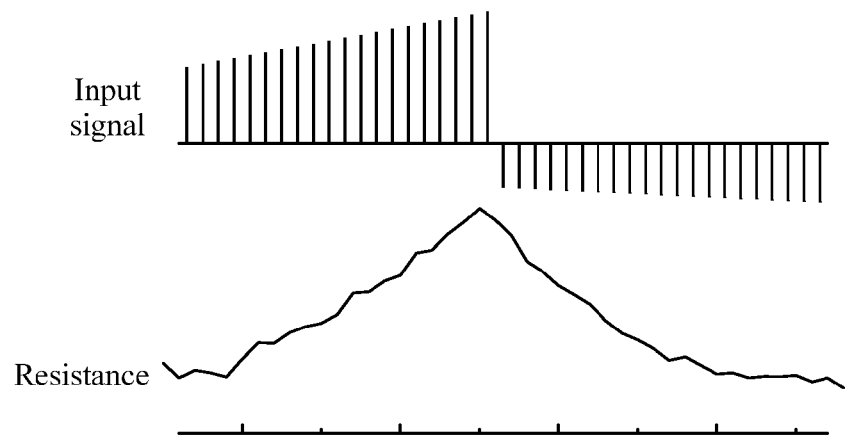
FIG. 5A illustrates gradual variation of a resistance of a neural synapse component with a pulse signal.

Referring to FIG. 5A, it can be seen that a resistor of a memristor-based neural synapse component features a gradual variation characteristic, namely, it can vary gradually with the number of pulse signals: as the pulse signal is positive, a resistance value of the resistor increases, as the pulse signal is negative, the resistance value thereof decreases, the larger a magnitude of a positive pulse signal is, the greater the resistance value of the resistor will be, the smaller a magnitude of a negative pulse signal is, the less the resistance value thereof will be.

Figure 5B:
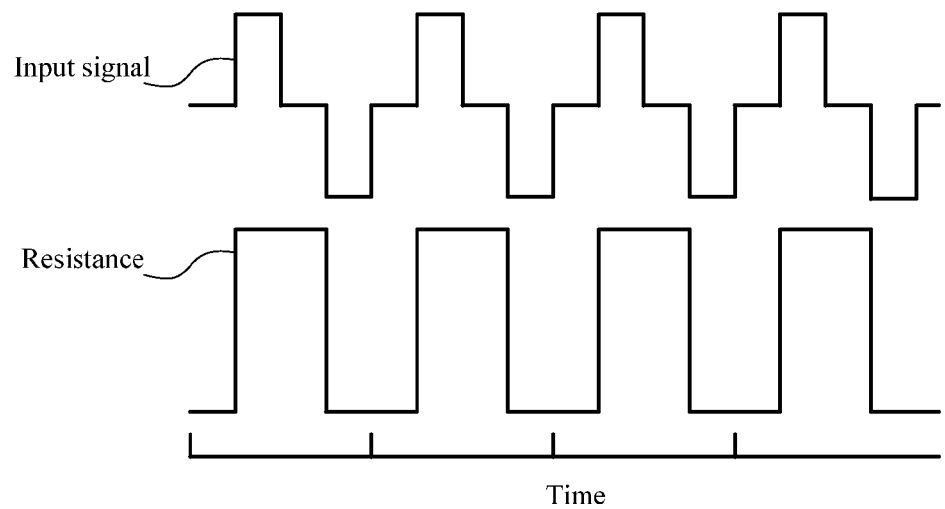
FIG. 5B illustrates a switching characteristic of the resistance of the neural synapse component with the pulse signal.

FIG. 5B indicates that the resistor of the memristor-based neural synapse component features a catastrophe characteristic of a binary switch. Once a positive or negative pulse signal is input, the neural synapse component can switch between a high-resistance state and a low-resistance state.

Figure 6A:
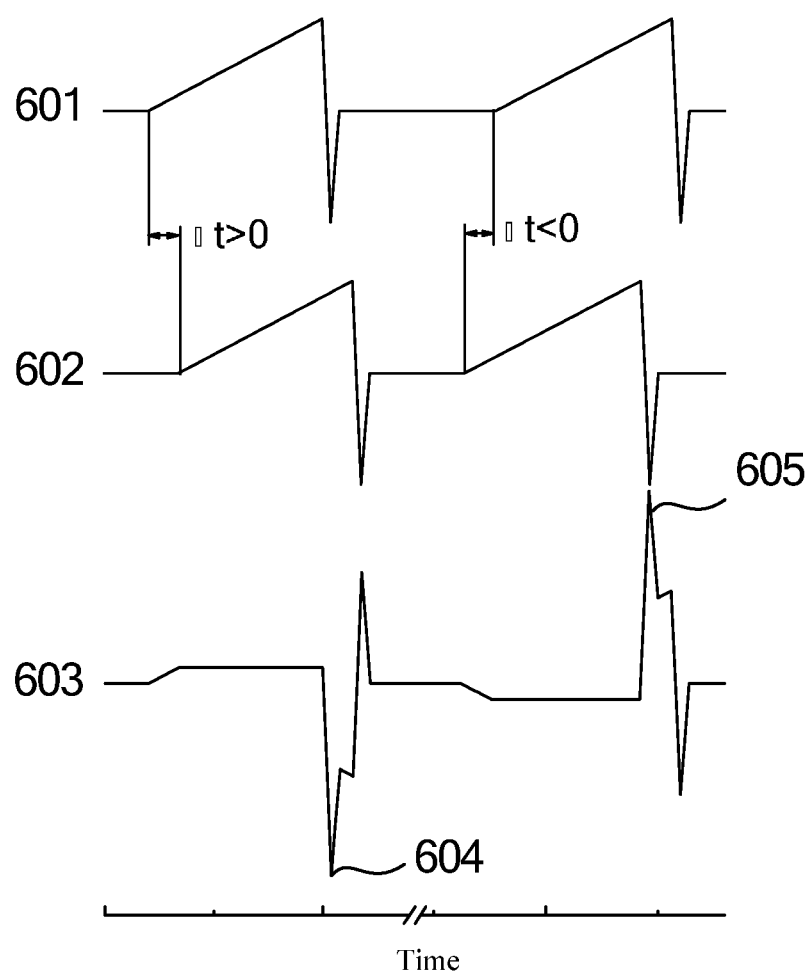
FIG. 6A illustrates an input signal applied to both terminal of a neural synapse component and enabling the component to generate STDP.
Figure 6B:
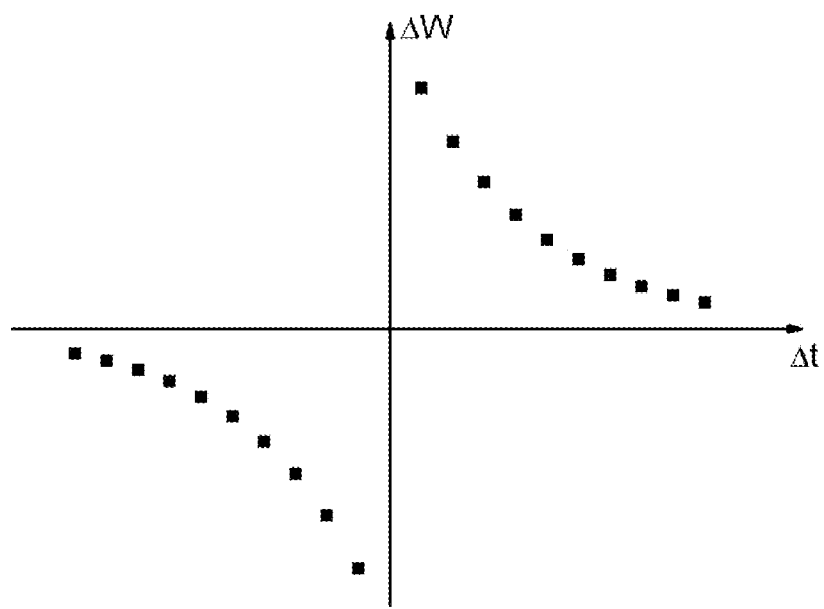
FIG. 6B illustrates STDP of the neural synapse component.

FIGS. 6A and 6B illustrate realization of a STDP function of a neural synapse component of an embodiment of the invention. A signal 601 is applied to the first electrode layer 401, another signal 602 is applied to the second electrode layer 403, and a further signal 603 is a signal difference between the first electrode layer 401 and the second electrode layer 403.

The first electrode layer 401 of the artificial synapse 100 is a presynaptic terminal, and the second electrode layer 403 thereof is a postsynaptic terminal. The signal 601 applied on the first electrode layer 401 is a presynaptic stimulation signal, and the signal 602 applied on the second electrode layer 403 is a postsynaptic stimulation signal. $\Delta t$ is a time difference between the presynaptic stimulation signal and the postsynaptic stimulation signal, as the presynaptic stimulation signal leads the postsynaptic stimulation signal, $\Delta t > 0$, and as presynaptic stimulation signal lags behind the postsynaptic stimulation signal, $\Delta t < 0$. A weight of the synapse $W = 1/R$, where R is a resistance value of the artificial synapse component, and $\Delta W$ represents variation of the weight of the synapse between presynaptic stimulation and postsynaptic stimulation.

As $\Delta t > 0$, a peak value 604 of a difference 603 between the presynaptic stimulation and the postsynaptic stimulation is negative, the resistance value of the artificial synapse decreases and the weight of the synapse increases under the action of the presynaptic stimulation and the postsynaptic stimulation. As $\Delta t < 0$, a peak value 605 of the difference 603 between the presynaptic stimulation and the postsynaptic stimulation is positive, the resistance value of the artificial synapse increases and the weight of the synapse decreases under the action of the presynaptic stimulation and the postsynaptic stimulation.

Referring to FIG. 6B, under the action of both the presynaptic stimulation signal 601 and the postsynaptic stimulation signal 602, the artificial synapse is capable of biologically realizing the STDP function, in which as $\Delta t > 0$, the resistance value of the of the artificial synapse decreases, the weight thereof increases, $\Delta W > 0$, and $\Delta W$ exponentially attenuates with $\Delta t$; and as $\Delta t < 0$, the resistance value of the artificial synapse increases, the weight thereof decreases, $\Delta W < 0$, and $\Delta W$ exponentially attenuates with $\Delta t$.

Figure 7:
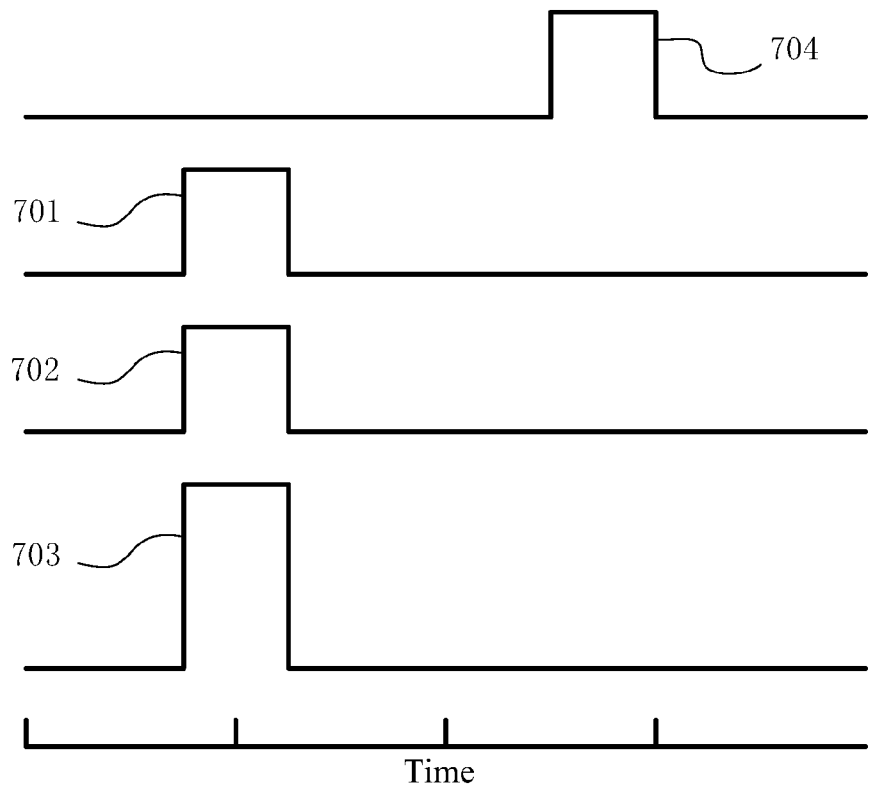
FIG. 7 is a curve illustrating a relationship between an input signal and a memristor of a third embodiment of the invention.

FIG. 7 illustrates an embodiment of the invention. A conditional stimulation signal (CS) 704 is applied on the first input terminal 301, and an unconditional stimulation signal (US) 701 is applied on the second input terminal 305. An initial state of the artificial synapse component is a high-resistance state. When only the unconditional stimulation signal (US) 701 is input, a signal 702 is to be obtained at an input terminal of the comparator after voltage division by a resistor, and an output signal 703 is to be generated by the comparator; When only the conditional stimulation signal (CS) is input, since a resistance value of a fixed value resistor is far less than that of a high-resistance artificial synapse component, a voltage at the input terminal of the comparator may be neglected after voltage division by the high-resistance artificial synapse component and the fixed value resistor, and no output signal is generated by the comparator. It should be noted that square wave in the figure is only an example of electric stimulation, and specific waveform thereof can be designed according to characteristics of the memristor.

Figure 8:
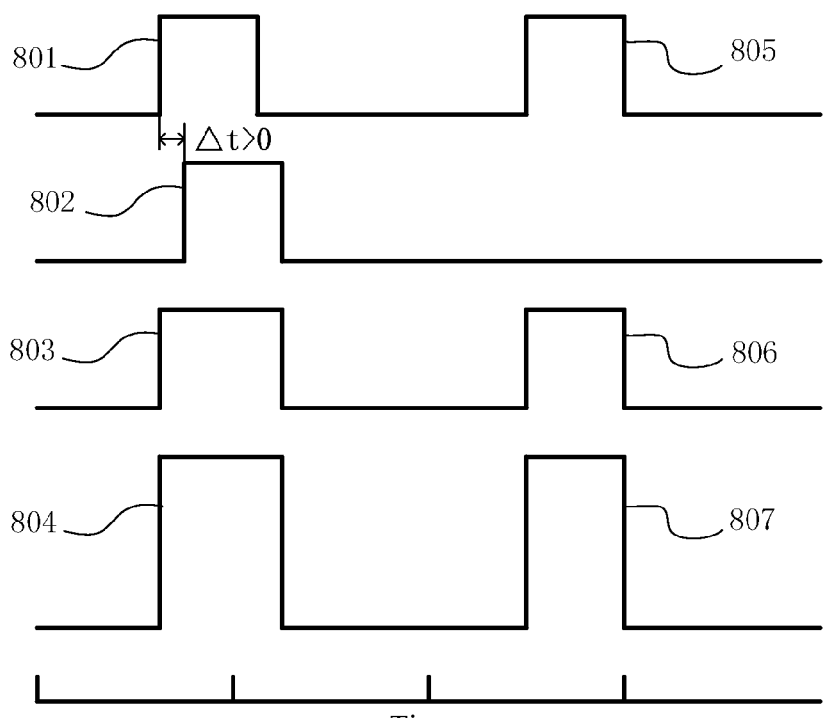
FIG. 8 is a curve illustrating a relationship between an input signal and a memristor of a fourth embodiment of the invention.

FIG. 8 illustrates another embodiment of the invention. A conditional stimulation signal (CS) 801 is applied to the first input terminal 301, and an unconditional stimulation signal (US) 802 is applied to the second input terminal 305. An initial state of the artificial synapse component is a high-resistance state. When both the unconditional stimulation signal (US) 801 and the conditional stimulation signal (CS) 802 are applied, after voltage division by a resistor, a signal 803 is to be obtained at an input terminal of the comparator due to voltage-division of the unconditional stimulation signal (US) 802, and an output signal 804 is to be generated by the comparator. Since the conditional stimulation signal (CS) leads the unconditional stimulation signal (US) (namely $\Delta t > 0$), a weight of the artificial synapse increases ($\Delta W > 0$), and a resistance value of the resistor decreases, and divided voltage by the fixed value resistor increases. As another conditional stimulation signal (CS) 805 is input, a signal 806 is to be obtained at the input terminal of the comparator after voltage division by the resistor, and an output signal 807 is to be generated by the comparator, namely as the conditional stimulation signal (CS) leads the unconditional stimulation signal (US) for a very short time, or both the signals are applied, associative memory is generated. It should be noted that square wave in the figure is only an example of electric stimulation, and specific waveform thereof can be designed according to characteristics of the memristor.

Figure 9:
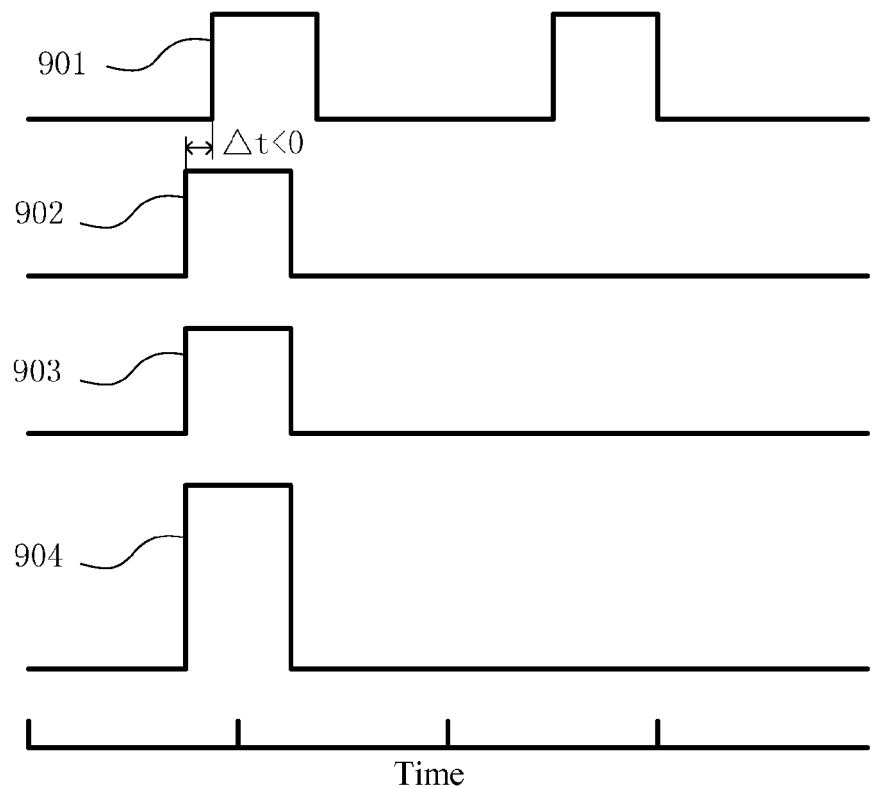
FIG. 9 is a curve illustrating a relationship between an input signal and a memristor of a fifth embodiment of the invention.

FIG. 9 illustrates still another embodiment of the invention. A conditional stimulation signal (CS) 901 is applied to the first input terminal 301, and an unconditional stimulation signal (US) 902 is applied to the second input terminal 305. An initial state of the artificial synapse component is a high-resistance state. When both the unconditional stimulation signal (US) 901 and the conditional stimulation signal (CS) 902 are applied, after voltage division by a resistor, a signal 903 is to be obtained at an input terminal of the comparator due to voltage-division of the unconditional stimulation signal (US) 902, and an output signal 904 is to be generated by the comparator. When the conditional stimulation signal (CS) lags behind the unconditional stimulation signal (US) (namely $\Delta t < 0$), a weight of the artificial synapse is to decrease ($\Delta W < 0$), and a resistance value of the resistor is to increase. At the time, since the resistor is in a high-resistance state, voltage division of the fixed value resistor is not significantly affected. As the conditional stimulation signal (CS) is input again, no output signal is generated by the comparator. Namely, as CS lags behinds US, it is impossible to generate the associative memory. It should be noted that square wave in the figure is only an example of electric stimulation, and specific waveform thereof can be designed according to characteristics of the memristor.

Figure 10A:
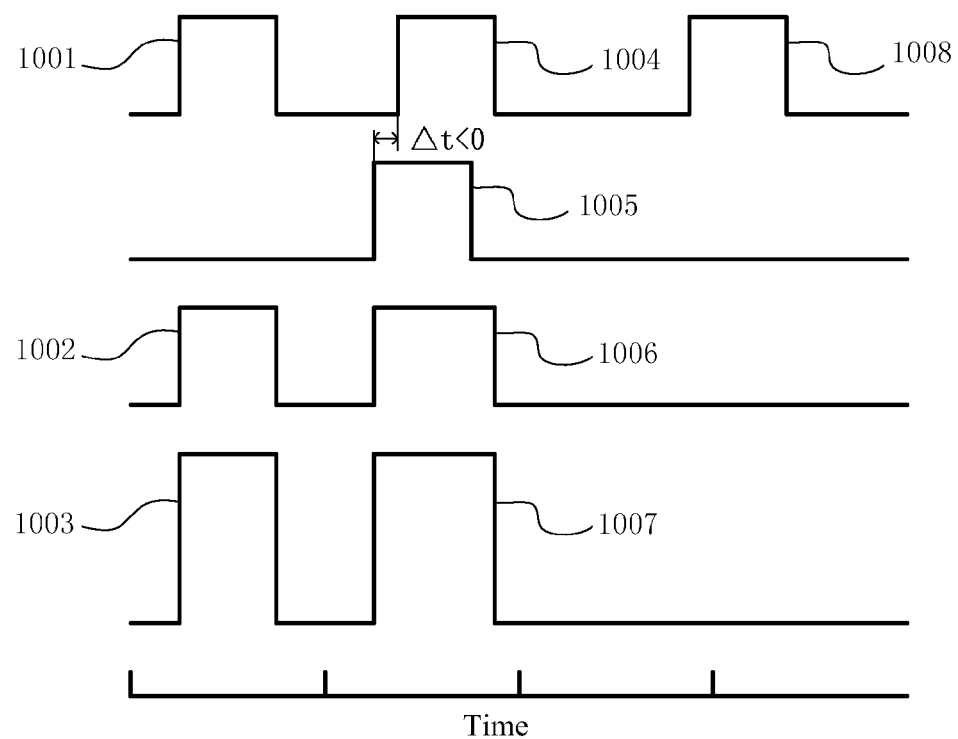
FIG. 10A illustrates associative memory is forgotten since a conditional stimulation signal leads an unconditional stimulation signal for a very long time.

FIG. 10A illustrates a further embodiment of the invention. A conditional stimulation signal (CS) 1004 is applied to the first input terminal 301, and an unconditional stimulation signal (US) 1005 is applied to the second input terminal 305. Assuming the neural synapse component already has an associative memory function (namely the neural synapse component is in a low-resistance state). As the conditional stimulation signal (CS) 1001 is input, a signal 1002 is to be obtained at an input terminal of the comparator after voltage division, and an output signal 1003 is to be generated by the comparator. When both the unconditional stimulation signal (US) 1005 and the conditional stimulation signal (CS) 1004 are applied, after voltage division by the resistor, a signal 1006 is to be obtained at the input terminal of the comparator due to voltage-division of the unconditional stimulation signal (US) 1005, and an output signal 1007 is to be generated by the comparator. When the unconditional stimulation signal (US) 1005 far lags behind the conditional stimulation signal (CS) (namely US leads a CS in the next period), the unconditional stimulation signal (US) 1005 is affected more significantly by the conditional stimulation signal (CS) 1004 in the next period. At the time, the unconditional stimulation signal (US) 1005 is deemed to lead the conditional stimulation signal (CS) 1004 in the next period (namely Δt<0), a weight of the artificial synapse decreases (ΔW<0), a resistance value of the resistor increases, and divided voltage by the fixed value resistor decreases. As the conditional stimulation signal (CS) 1008 is input again, no output signal is generated by the comparator, and thus the associative memory is forgotten.

Figure 10B:
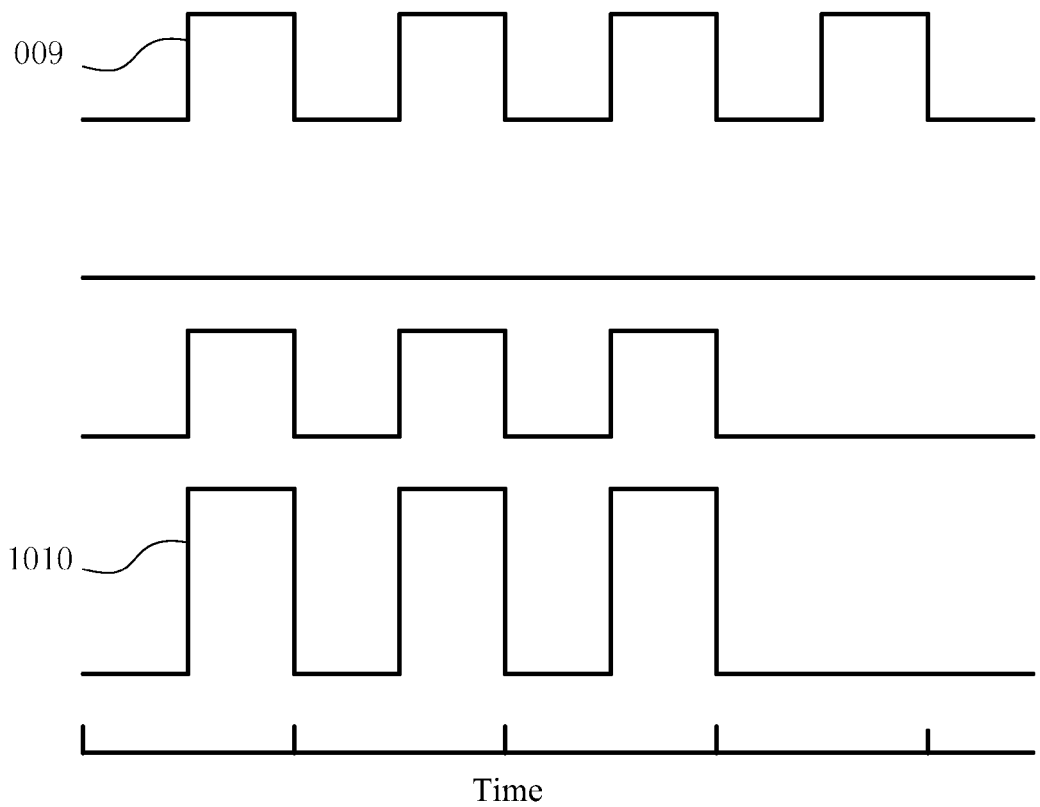
FIG. 10B illustrates associative memory is forgotten since only a conditional stimulation signal is continuously input.

FIG. 10B illustrates a forgetting process of another associative memory. As a conditional stimulation signal is input to a terminal 1009, no output signal is generated at another terminal 1010 since associative memory already exists in the circuit. When conditional simulation signals are continuously applied, both a weight of the synapse and a signal at an input terminal of the comparator keep decreasing. As the number of the unconditional stimulation signals reaches a certain number, no output signal is generated at the terminal 1010, and the associative memory is forgotten. It should be noted that square wave in the figure is only an example of electric stimulation, and specific waveform thereof can be designed according to characteristics of the memristor.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. An associative memory circuit, comprising: a memristor having a first resistance value and a second resistance value, a first resistor, a second resistor, and an operational comparator; wherein
   the first resistance value is greater than the second resistance value;
   each of a resistance value of the first resistor and a resistance value of the second resistor is substantially equal to the second resistance value of the memristor;
   one terminal of the memristor operates as a first input terminal of the associative memory circuit, and the other terminal of the memristor is connected to a first input terminal of the operational comparator;
   one terminal of the first resistor operates as a second input terminal of the associative memory circuit, and the other terminal of the first resistor is connected to the first input terminal of the operational comparator;
   one terminal of the second resistor is connected to the first input terminal of the operational comparator, and the other terminal of the second resistor is connected to the ground;
   a second input terminal of the operational comparator is connected to a reference voltage, and an output terminal of the operational comparator operates as an output terminal of the associative memory circuit;
   the first input terminal and the second input terminal of the associative memory circuit operate to receive a conditional stimulation signal and an unconditional stimulation signal, respectively; and
   the operational comparator is adapted to compare a voltage on the first input terminal of the operational comparator and the reference voltage, wherein the output terminal of the associative memory circuit outputs a response signal when the voltage on the first input terminal of the operational comparator is lower than the reference voltage, and the output terminal of the associative memory circuit does not output the response signal when the voltage on the first input terminal of the operational comparator is higher than the reference voltage.

2. The associative memory circuit of claim 1, wherein
   as the conditional stimulation signal is input immediately prior to the unconditional stimulation signal, or both the conditional stimulation signal and the unconditional stimulation signal are input simultaneously, the associative memory circuit realizes associative memory;
   as the conditional stimulation signal is input after the unconditional stimulation signal, the associative memory circuit cannot realize the associative memory; and
   after the associative memory is realized, when the conditional stimulation signal and the unconditional stimulation signal are input simultaneously, as the conditional stimulation signal leads the unconditional stimulation signal for a very long time, the associative memory is to be forgotten, when only the conditional stimulation signal is continuously input, the associative memory is to be forgotten.

3. The associative memory circuit of claim 1, wherein a value of the reference voltage is determined by a voltage value of a signal applied to the first input terminal of the operational comparator.

4. The associative memory circuit of claim 1, wherein the memristor comprises a first electrode layer, a functional material layer, and a second electrode layer that are sequentially and electrically connected.

5. The associative memory circuit of claim 4, wherein the functional material layer is made of oxide comprising $TiO_x$, $TaO_x$, $WO_x$, $CuO_x$, $AlO_x$, $NiO_x$, $HfO_x$, $ZrO_x$, $SiO_x$, $NbO_x$, $VO_x$, or $GeO_x$, or made of chalcogenide comprising GeSe, $Ag_2Se$, $Ag_2S$, $Cu_2S$, $GeS_x$, $Ge_2Sb_2Te_5$, GeTe, or AgInSbTe, or made of materials of perovskite structure comprising $SrTiO_3$, $BaTiO_3$, $BiFeO_3$, $CaMnO_3$, $PrMnO_3$, or $La_{0.7}Sr_{0.3}MnO_3$.

6. An associative memory circuit, comprising: a memristor having a first resistance value and a second resistance value, a first resistor, a second resistor, and an operational comparator; wherein
   the first resistance value is greater than the second resistance value;
   each of a resistance value of the first resistor and a resistance value of the second resistor is substantially equal to the second resistance value of the memristor;
   the first resistor and the memristor are sequentially connected to a first input terminal of the operational comparator in series, and a non-series connected terminal of the memristor operates as a first input terminal of the associative memory circuit;
   a serially connected terminal of the first resistor and the memristor operates as a second input terminal of the associative memory circuit;
   one terminal of the second resistor is connected to the first input terminal of the operational comparator, and the other terminal of the second resistor is connected to the ground;
   a second input terminal of the operational comparator is connected to a reference voltage, and an output terminal of the operational comparator operates as an output terminal of the associative memory circuit;
   the first input terminal and the second input terminal of the associative memory circuit operate to receive a conditional stimulation signal and an unconditional stimulation signal, respectively; and the operational comparator is adapted to compare a voltage on the first input terminal of the operational comparator and the reference voltage, wherein the output terminal of the associative memory circuit outputs a response signal when the voltage on the first input terminal of the operational comparator is lower than the reference voltage, and the output terminal of the associative memory circuit does not output the response signal when the voltage on the first input terminal of the operational comparator is higher than the reference voltage.

7. The associative memory circuit of claim 6, wherein as the conditional stimulation signal is input immediately prior to the unconditional stimulation signal, or both the conditional stimulation signal and the unconditional stimulation signal are input simultaneously, the associative memory circuit realizes associative memory;

as the conditional stimulation signal is input after the unconditional stimulation signal, the associative memory circuit cannot realize the associative memory; and after the associative memory is realized, when the conditional stimulation signal and the unconditional stimulation signal are input simultaneously, as the conditional stimulation signal leads the unconditional stimulation signal for a very long time, the associative memory is to be forgotten, when only the conditional stimulation signal is continuously input, the associative memory is to be forgotten.

8. The associative memory circuit of claim 6, wherein a value of the reference voltage is determined by a voltage value of a signal applied to the first input terminal of the operational comparator.

9. The associative memory circuit of claim 6, wherein the memristor comprises a first electrode layer, a functional material layer, and a second electrode layer that are sequentially and electrically connected.

10. The associative memory circuit of claim 9, wherein the functional material layer is a functional material layer made of oxide comprising $TiO_x$, $TaO_x$, $WO_x$, $CuO_x$, $AlO_x$, $NiO_x$, $HfO_x$, $ZrO_x$, $SiO_x$, $NbO_x$, $VO_x$, or $GeO_x$; the functional material layer is a functional material layer made of chalcogenide comprising $GeSe$, $Ag_2Se$, $Ag_2S$, $Cu_2S$, $GeS_x$, $Ge_2Sb_2Te_5$, $GeTe$, or $AgInSbTe$; and the functional material layer is a functional material layer made of materials of perovskite structure comprising $SrTiO_3$, $BaTiO_3$, $BiFeO_3$, $CaMnO_3$, $PrMnO_3$, or $La_{0.7}Sr_{0.3}MnO_3$.

* * * * *